United States Patent
Yeh et al.

(10) Patent No.: US 11,244,914 B2
(45) Date of Patent: Feb. 8, 2022

(54) BOND PAD WITH ENHANCED RELIABILITY

(71) Applicant: Taiwan Semiconductor Manufacturing Co., Ltd., Hsin-Chu (TW)

(72) Inventors: Tzu-Hsuan Yeh, Hsin-Chu (TW); Chern-Yow Hsu, Chu-Bei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/866,752

(22) Filed: May 5, 2020

(65) Prior Publication Data

US 2021/0351142 A1 Nov. 11, 2021

(51) Int. Cl.
*H01L 23/00* (2006.01)
*H01L 21/308* (2006.01)

(52) U.S. Cl.
CPC ............ *H01L 24/03* (2013.01); *H01L 21/308* (2013.01); *H01L 24/05* (2013.01); *H01L 2224/03831* (2013.01)

(58) Field of Classification Search
CPC combination set(s) only.
See application file for complete search history.

(56) References Cited

U.S. PATENT DOCUMENTS

| | | | |
|---|---|---|---|
| 8,501,614 B1* | 8/2013 | Shih | H01L 24/13 438/612 |
| 10,892,239 B1* | 1/2021 | Chockalingam | H01L 24/05 |
| 2002/0093098 A1 | 7/2002 | Barr et al. | |
| 2004/0188851 A1* | 9/2004 | Takewaki | H01L 21/76886 257/774 |
| 2005/0048755 A1* | 3/2005 | Roche | H01L 24/05 438/612 |
| 2014/0116760 A1* | 5/2014 | Wang | H01L 23/3192 174/257 |
| 2015/0061156 A1* | 3/2015 | Jiang | H01L 21/76879 257/774 |
| 2017/0221950 A1* | 8/2017 | Ho | H01L 27/1462 |
| 2019/0096831 A1* | 3/2019 | Su | H01L 21/31116 |
| 2021/0043560 A1* | 2/2021 | Leng | H01L 23/53228 |

* cited by examiner

*Primary Examiner* — Mamadou L Diallo
(74) *Attorney, Agent, or Firm* — Eschweiler & Potashnik, LLC

(57) ABSTRACT

The present disclosure, in some embodiments, relates to a method of forming an integrated chip. The method may be performed by forming a bond pad layer onto a dielectric structure formed over a substrate. The dielectric structure surrounds a plurality of interconnect layers. A protective layer is formed onto the bond pad layer, and the bond pad layer and the protective layer are patterned to define a bond pad covered by the protective layer. One or more upper passivation layers are formed over the protective layer. A dry etching process is performed to form an opening extending through the one or more upper passivation layers to the protective layer. A wet etching process is performed to remove a part of the protective layer and expose an upper surface of the bond pad.

20 Claims, 10 Drawing Sheets

BOND PAD WITH ENHANCED RELIABILITY

BACKGROUND

Integrated chip fabrication is a complex multiple-step process during which electronic circuits are formed on a wafer made out of a semiconducting material (e.g., silicon). Integrated chip fabrication can be broadly divided into front-end-of-line (FEOL) processing and back-end-of-line (BEOL) processing. FEOL processing generally relates to the formation of devices (e.g., transistors) within the semiconductor material, while BEOL processing generally relates to the formation of conductive interconnect layers within a dielectric structure over the semiconductor material. After BEOL processing is completed, bond pads are formed and then the wafer may be singulated (e.g., diced) to form a plurality of separate integrated chip die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
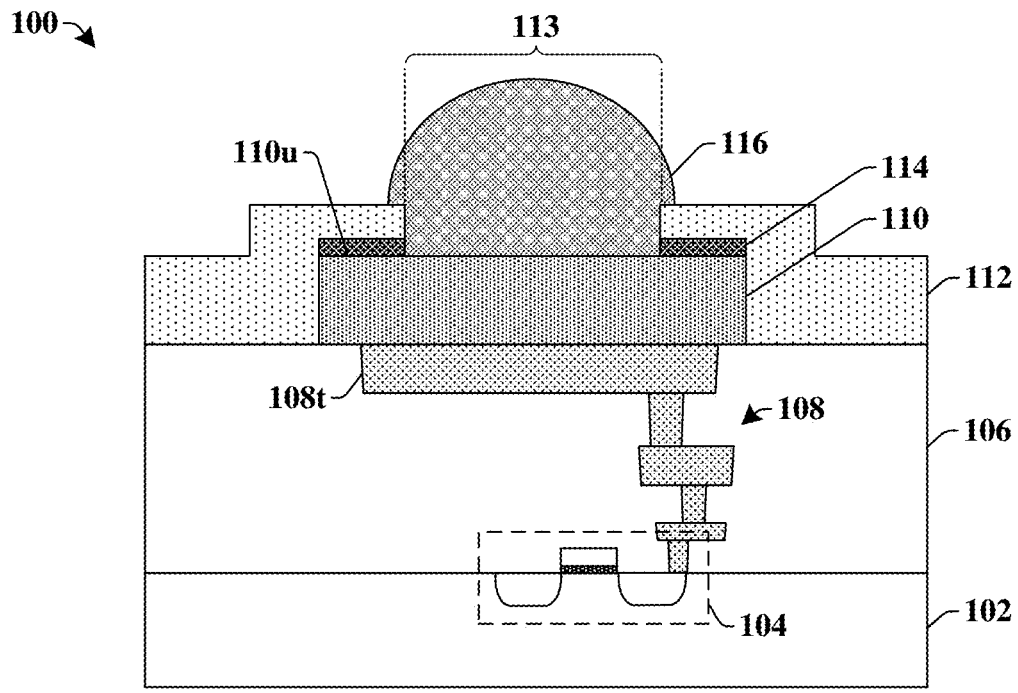
FIG. 1 illustrates a cross-sectional view of some embodiments of an integrated chip having a protective layer configured to improve a reliability of a bond pad.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During integrated chip fabrication, a bond pad may be formed over a dielectric structure surrounding a plurality of conductive interconnect layers. The bond pad may be formed by depositing a conductive material (e.g., a metal) over an interconnect layer and subsequently patterning the conductive material to define a bond pad. After defining a bond pad, one or more passivation layers may be formed onto the bond pad. The one or more passivation layers are subsequently patterned to form an opening that exposes the bond pad.

The opening may be formed by performing a first etching process on the one or more passivation layers. The first etching process may use a dry etchant having a fluorine etching chemistry. However, it has been appreciated that fluorine from the dry etchant may interact with a metal of the bond pad (e.g., aluminum) to form a fluorinated byproduct (e.g., $AlF_3$) on the bond pad. The fluorinated byproduct can react with moisture (e.g., from air, subsequent wet cleaning processes, etc.) to form compounds that can damage the bond pad (e.g., to form $AlOH_3$ and $3HF$) and lead to electrical failure.

Therefore, to remove the fluorinated byproduct, a second etching process may be performed using a non-fluorine based etchant (e.g., argon). However, while the non-fluorine based etchant may remove the fluorinated byproduct, the non-fluorine based etchant may also damage the underlying bond pad, thereby giving the bond pad a rough surface. The rough surface causes a poor adhesion and/or electrical connection with an overlying conductor (e.g., a solder bump). Furthermore, to avoid contamination the second etching process using the non-fluorine based etchant may be performed in a dedicated chamber. However, the use of a dedicated chamber for the second etching process can slow throughput. The slow throughput can cause reliability problems with the bond pad since the fluorinated by product will absorb moisture over time and degrade the bond pad. Therefore, the slow throughput can cause violation of q-time requirements of the second etching process (e.g., the etching process may have a q-time of approximately 2 hours), thereby driving rework of a substrate and further hurting throughput and increasing costs associated with the fabrication process.

The present disclosure, in some embodiments, relates to a method of forming an integrated chip having a bond pad structure comprising a protective layer that is disposed onto a bond pad and that is configured to mitigate formation of etching byproducts (e.g., fluorine-metal byproducts) onto the bond pad. The method may be performed by forming a plurality of interconnect layers within a dielectric structure formed over a substrate. A bond pad layer is formed onto a dielectric structure and a protective layer is formed onto the bond pad layer. The bond pad layer and the protective layer are patterned to define a bond pad covered by the protective layer. One or more upper passivation layers are formed over the protective layer. A dry etching process is performed to form an opening extending through the one or more upper passivation layers to the protective layer. A wet etching process is subsequently performed to remove the protective layer and expose an upper surface of the bond pad. Therefore, the method uses the protective layer to prevent byproducts of the dry etching process from building up on the bond pad and therefore removes a need to subsequently act upon the bond pad with a non-fluorine based dry etchant. Furthermore, using a wet etching process to remove the protective layer mitigates damage to the bond pad, thereby resulting in a bond pad having a smooth upper surface that provides the bond pad with a good reliability.

FIG. 1 illustrates a cross-sectional view of some embodiments of an integrated chip 100 having a protective layer configured to improve a reliability of a bond pad.

The integrated chip 100 comprises a dielectric structure 106 disposed over a substrate 102. In some embodiments, one or more transistor devices 104 may be disposed within the substrate 102. The dielectric structure 106 surrounds a plurality of interconnect layers 108. In some embodiments, the plurality interconnect layers 108 may be electrically coupled to the one or more transistor devices 104 within the substrate 102. In some embodiments, the plurality of interconnect layers 108 may comprise a top interconnect layer 108$t$ disposed along an uppermost surface of the dielectric structure 106.

A bond pad 110 is disposed over the dielectric structure 106. In some embodiments, the bond pad 110 may be disposed directly over the top interconnect layer 108$t$. In other embodiments (not shown), one or more redistribution layers may be disposed between the plurality of interconnect layers 108 and the bond pad 110. A passivation structure 112 surrounds the bond pad 110. In some embodiments, the passivation structure 112 may comprise one or more passivation layers respectively comprising different dielectric materials. In some embodiments, the passivation structure 112 may extend from along sidewalls of the bond pad 110 to directly over a top of the bond pad 110. The passivation structure 112 has sidewalls that define an opening 113 over the bond pad 110. The opening 113 extends completely through the passivation structure 112 to an upper surface of the bond pad 110. A conductive bonding structure 116 is disposed within the opening 113 and on the upper surface 110$u$ of the bond pad 110. In some embodiments, the conductive bonding structure 116 may comprise a conductive bump (e.g., a solder bump), a conductive post (e.g., a copper post, a copper micro-post), an under bump metallurgy (UBM), or the like.

A protective layer 114 is disposed vertically between the top of the bond pad 110 and the passivation structure 112, and has sidewalls that further define the opening 113. The protective layer 114 comprises a material that has a high etching selectivity with respect to the passivation structure 112 and/or the bond pad 110. The high etching selectivity allows for the protective layer 114 to be etched at a different rate (e.g., a higher rate and/or a lower rate) than the passivation structure 112 and/or the bond pad 110. For example, in some embodiments, the protective layer 114 may comprise a material that etches at a lower rate than the passivation structure 112 when exposed to a first etchant (e.g., a dry etchant) and that etches at a higher rate than the passivation structure 112 when exposed to a second etchant (e.g., a wet etchant). In some embodiments, the protective layer 114 may comprise a material that also etches at a higher rate than the bond pad 110 when exposed to the second etchant (e.g., the wet etchant). In some embodiments, the protective layer 114 may comprise a metal, such as titanium (e.g., TiN), for example.

The high etching selectivity between the protective layer 114 and the passivation structure 112 allows for the opening 113 within the passivation structure 112 to be formed by a first etching process that does not etch through the protective layer 114. Being able to form the opening 113 within the passivation structure 112 without etching through the protective layer 114 allows for byproducts of the first etching process to form on the protective layer 114 rather than the bond pad 110. Furthermore, the high etching selectivity between the protective layer 114 and the bond pad 110 allows for parts of the protective layer 114 to be removed by a second etching process that does not significantly damaging the bond pad 110, thereby causing the upper surface 110$u$ of the bond pad 110 to have a smoothness that provides the bond pad 110 with a good reliability.

Figure 2A:
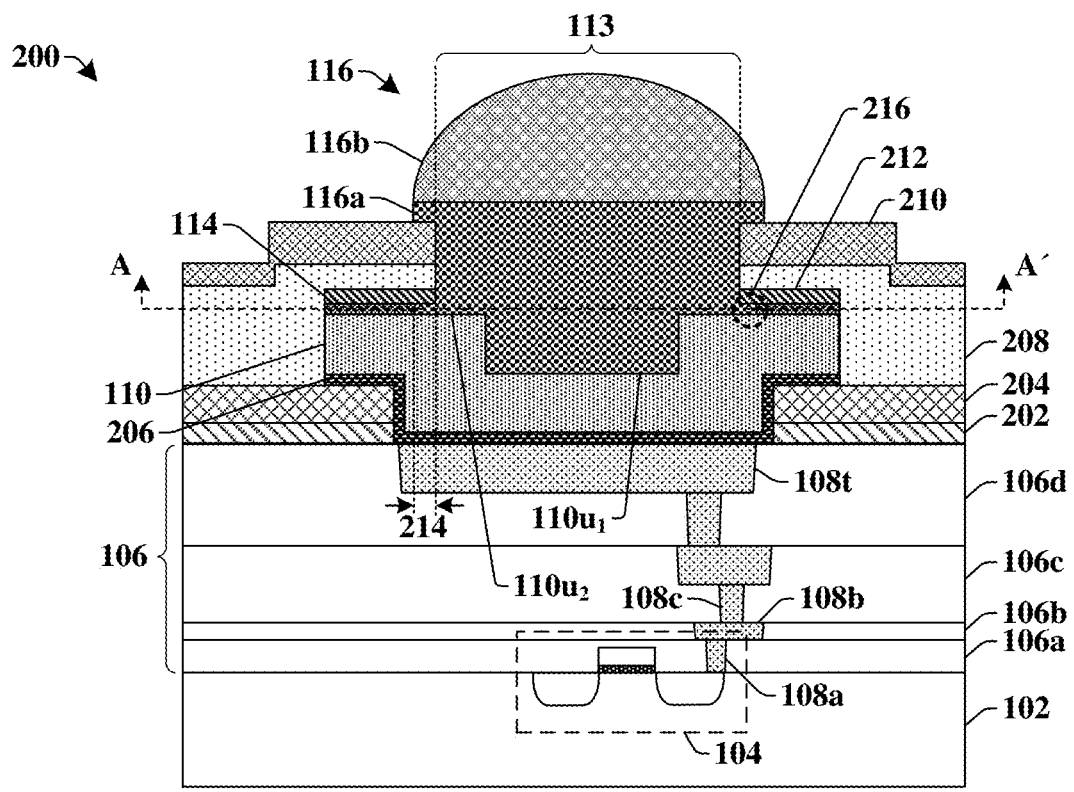
FIGS. 2A-2B illustrate additional embodiments of an integrated chip having a protective layer configured to improve a reliability of a bond pad.

FIG. 2A illustrates a cross-sectional view of some additional embodiments of an integrated chip 200 having a protective layer configured to improve a reliability of a bond pad.

The integrated chip 200 comprises a dielectric structure 106 arranged over a substrate 102. The dielectric structure 106 comprises a plurality of stacked ILD layers 106$a$-106$d$. In some embodiments, the plurality of stacked ILD layers 106$a$-106$d$ may be separated by etch stop layers (not shown). In various embodiments, the plurality of stacked ILD layers 106$a$-106$d$ may comprise one or more of an oxide (e.g., $SiO_2$, SiCO, etc.), a fluorosilicate glass, a phosphate glass (e.g., borophosphate silicate glass), or the like.

The dielectric structure 106 surrounds a plurality of interconnect layers 108$a$-108$c$. The plurality of interconnect layers 108$a$-108$c$ may comprise conductive contacts 108$a$, interconnect wires 108$b$, and/or interconnect vias 108$c$. In various embodiments, the plurality of interconnect layers 108$a$-108$c$ may comprise aluminum, copper, tungsten, and/or the like. In some embodiments, the plurality of interconnect layer 108$a$-108$c$ may be coupled to a transistor device 104 disposed within the substrate 102. In various embodiments, the transistor device 104 may comprise a MOSFET (metal-oxide-semiconductor field-effect transistor) device, a BJT (bipolar junction transistor) device, a HEMT (high electron mobility transistor) device, or the like.

A bond pad 110 is arranged over the dielectric structure 106. The bond pad 110 comprises a conductive material, such as aluminum, copper, and/or the like. In various embodiments, the bond pad 110 may have a thickness that is in a range of between approximately 8,000 Angstroms (Å) and approximately 15,000 Å, between approximately 10,000 Å and approximately 13,000 Å, between approximately 11,000 Å and approximately 12,000 Å, or other suitable values. In some embodiments, a glue layer 206 may be disposed between the bond pad 110 and a top interconnect layer 108$t$ disposed along an uppermost surface of the dielectric structure 106. The glue layer 206 is configured to operate as a barrier layer between the bond pad 110 and the dielectric structure 106. In some embodiments, the glue layer 206 may also improve adhesion between the bond pad 110 and the top interconnect layer 108$t$. In some embodiments, the glue layer 206 may comprise tantalum nitride, titanium nitride, or the like.

The bond pad 110 is laterally surrounded by one or more lower passivation layers 202-204. In some embodiments, the bond pad 110 may comprise a horizontally extending surface that is disposed over the one or more lower passivation layers 202-204. In some such embodiments, the bond pad 110 may comprise a central region having a first upper surface $110u_1$ and a peripheral region having a second upper surface $110u_2$ over the first upper surface $110u_1$. In some embodiments, the one or more lower passivation layers 202-204 may comprise a first lower passivation layer 202 disposed on the dielectric structure 106 and a second lower passivation layer 204 disposed on the first lower passivation layer 202. In some embodiments, the first lower passivation layer 202 may comprise a nitride (e.g., silicon nitride), a carbide (e.g., silicon carbide), or the like. In some embodiments, the second lower passivation layer 204 may comprise an oxide, an undoped silicate glass (USG), borophosphosilicate glass (BPSG), or the like. In some embodiments, the first lower passivation layer 202 may have a thickness that is in a range of between approximately 500 Å and approximately 1,000 Å, between approximately 600 Å and approximately 800 Å, or other suitable values. In some embodiments, the second lower passivation layer 204 may have a thickness that is in a range of between approximately 5,000 Å and approximately 10,000 Å, between approximately 8,000 Å and approximately 9,000 Å, or other suitable values.

In some embodiments, one or more upper passivation layers 208-210 are disposed over the bond pad 110. The one or more upper passivation layers 208-210 may comprise a first upper passivation layer 208 disposed on the second lower passivation layer 204 and a second upper passivation layer 210 disposed on the first upper passivation layer 208. The one or more upper passivation layers 208-210 have sidewalls that define an opening 113 directly over the bond pad 110. In some embodiments, the first upper passivation layer 208 may comprise an oxide, USG, BPSG, or the like. In some embodiments, the first upper passivation layer 208 may have a thickness that is in a range of between approximately 10,000 Å and approximately 15,000 Å, between approximately 11,000 Å and approximately 12,500 Å, or other suitable values. In some embodiments, the second upper passivation layer 210 may comprise a nitride (e.g., silicon nitride), a carbide (e.g., silicon carbide), or the like. In some embodiments, the second upper passivation layer 210 may have a thickness that is in a range of between approximately 5,000 Å and approximately 10,000 Å, between approximately 8,000 Å and approximately 9,000 Å, or other suitable values.

Figure 2B:
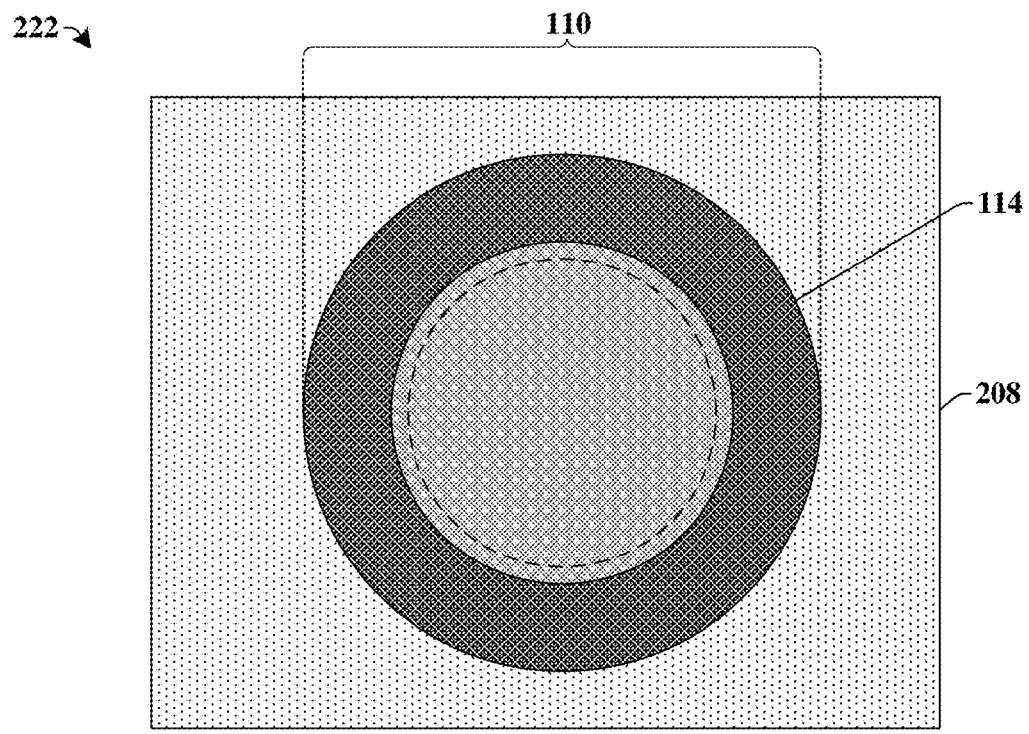

A protective layer 114 is disposed vertically between the second upper surface $110u_2$ of the bond pad 110 and the first upper passivation layer 208. In some embodiments, the protective layer 114 is completely confined over the bond pad 110. As shown in top-view 222 of FIG. 2B (taken along cross-sectional line A-A' of FIG. 2A), the protective layer 114 may continuously extend around a perimeter of the bond pad 110 in an unbroken path. In some embodiments, the protective layer 114 may comprise a ring shape.

In some embodiments, the protective layer 114 is or comprises a metal or a metallic compound. For example, the protective layer 114 may comprise titanium nitride, tantalum nitride, titanium oxide, or the like. In some such embodiments, the protective layer 114 may have one or more sidewalls that comprise a metal and that further define the opening 113. In some embodiments, the protective layer 114 may have a thickness that is in a range of between approximately 100 Å and approximately 500 Å, between approximately 250 Å and approximately 350 Å, or other suitable values. By having a thickness that is greater than approximately 100 Å, the protective layer 114 is able to prevent an etching process used to from the opening 113 within the one or more upper passivation layers 208-210 from damaging the bond pad 110. By having a thickness that is less than 500 Å, the protective layer 114 is able to be quickly removed to expose the bond pad 110 with a small impact on throughput.

A mask layer 212 is disposed vertically between the protective layer 114 and the first upper passivation layer 208. In some embodiments, the protective layer 114 has a bottom surface contacting the bond pad 110 and an upper surface contacting the mask layer 212. In some embodiments, the mask layer 212 may comprise a nitride (e.g., silicon oxynitride), a carbide (e.g., silicon oxycarbide), or the like. In some embodiments, the mask layer 212 may have a thickness that is in a range of between approximately 200 Å and approximately 500 Å, between approximately 250 Å and approximately 350 Å, or other suitable values.

The protective layer 114 and the mask layer 212 respectively comprise one or more sidewalls that further define the opening 113. In some embodiments, the protective layer 114 has a sidewall that is laterally setback by a non-zero distance 214 from a sidewall of the first upper passivation layer 208, the second upper passivation layer 210, and/or the mask layer 212. In some embodiments, the non-zero distance 214 may be in a range of between approximately 50 Å and approximately 500 Å, between approximately 200 Å and approximately 350 Å, or other suitable values. The lateral setback of the sidewall of the protective layer 114 causes the mask layer 212 to overhang the protective layer 114 and to form a cavity 216 along a side of the opening 113. The cavity 216 is defined by the second upper surface $110u_2$ of the bond pad 110, the sidewall of the protective layer 114, and a lower surface of the mask layer 212.

A conductive bonding structure 116 is disposed over the bond pad 110. In some embodiments, the conductive bonding structure 116 may comprise a conductive post 116a and a cap layer 116b over the conductive post 116a. In some embodiments, the conductive post 116a may comprise a copper post, a copper micro-post, or the like. In some embodiments, the cap layer 116b may comprise one or more of tin, gold, or the like. In some embodiments, the conductive post 116a may be disposed within the cavity 216. In some embodiments the conductive post 116a may completely fill the cavity 216. In other embodiments, the conductive post 116a may not completely fill the cavity 216, thereby leaving a void (not shown) between a sidewall of the conductive post 116a and the sidewall of the protective layer 114.

Figure 3A:
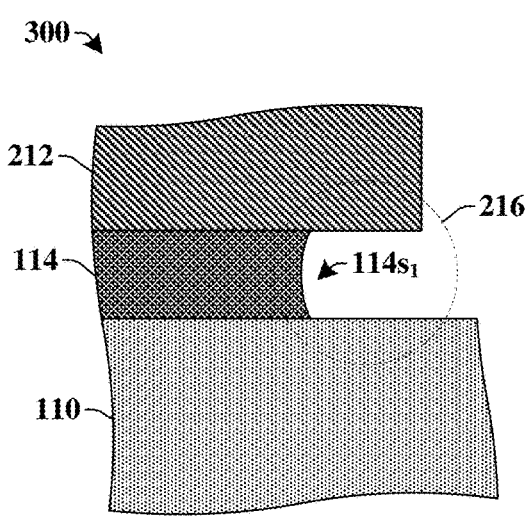
FIGS. 3A-3B illustrate cross-sectional views of some additional embodiments of a protective layer disposed on a bond pad.
Figure 3B:
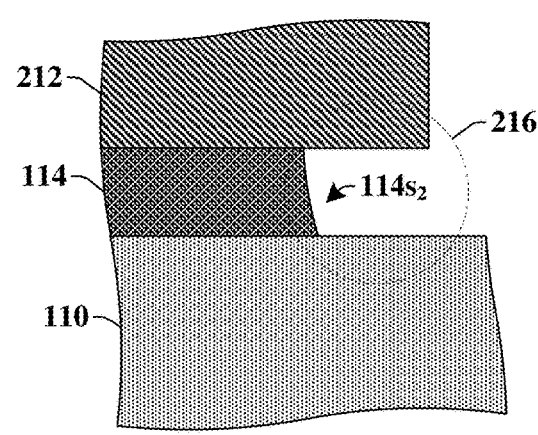

In various embodiments, the sidewall of the protective layer (e.g., protective layer 114 of FIG. 2A) may have different sidewall profiles. For example, in some embodiments, the sidewall of the protective layer may have a curved sidewall profile due to an etching process used to etch the protective layer. FIGS. 3A-3B illustrate cross-sectional views of some non-limiting embodiments of a protective layer 114 having different sidewall profiles.

As shown in FIGS. 3A-3B, the protective layer 114 has a curved sidewall profile that causes the protective layer 114 to have a sidewall with a concave curvature defining a cavity 216. A mask layer 212, which is disposed on a top surface of the protective layer 114, has a sidewall that has a smaller curvature. For example, the mask layer 212 may have a sidewall that is substantially flat.

In some embodiments, shown in cross-sectional view 300 of FIG. 3A, the protective layer 114 may have a curved sidewall $114s_1$ with a curvature that has a largest slope at a point that is vertically between a top surface and a bottom surface of the protective layer 114. In such embodiments, the curved sidewall 114s₁ gives the protective layer 114 a smallest width along a line that is vertically between a top surface and a bottom surface of the protective layer 114. In other embodiments, shown in cross-sectional view 302 of FIG. 3B, the protective layer 114 may have a curved sidewall 114s₂ that has a largest slope at a point along a top surface of the protective layer 114. In such embodiments, the curved sidewall 114s₂ may have a curvature that gives the protective layer 114 a smallest width along a top surface the protective layer 114.

Figure 4:
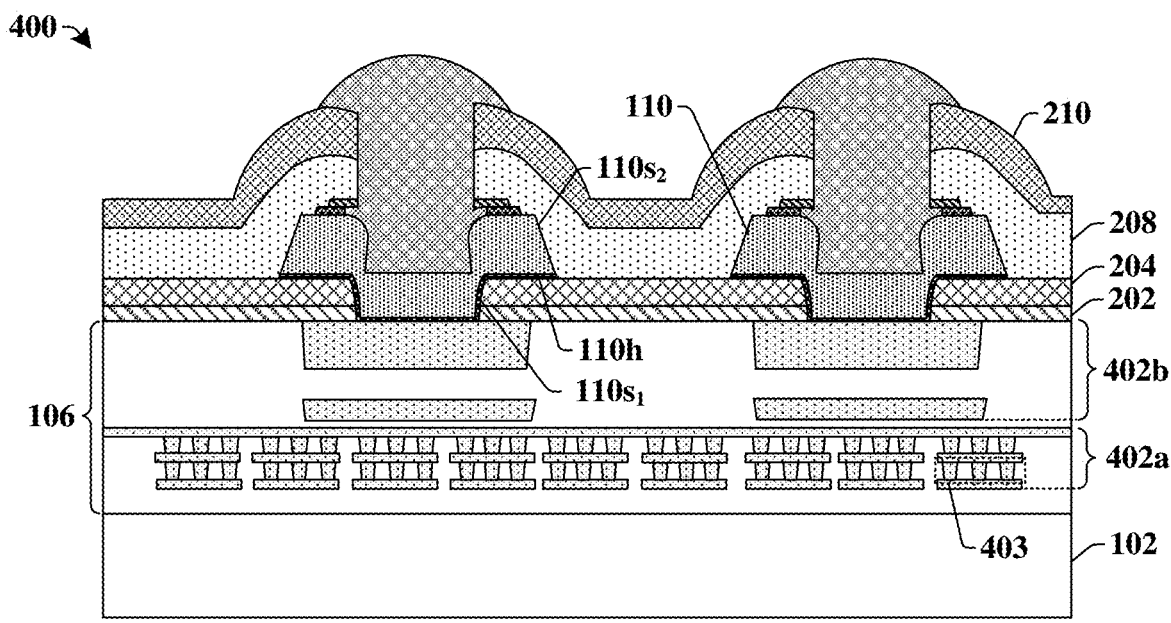
FIG. 4 illustrates a cross-sectional view of some additional embodiments of an integrated chip having a protective layer configured to improve a reliability of a bond pad.

FIG. 4 illustrates a cross-sectional view of some additional embodiments of an integrated chip 400 having a protective layer configured to improve a reliability of a bond pad.

The integrated chip 400 comprises a dielectric structure 106 disposed over a substrate 102. A plurality of interconnect layers are disposed within the dielectric structure 106. In some embodiments, the plurality of interconnect layers may comprise lower interconnect layers 402a and upper interconnect layers 402b. In some embodiments, the lower interconnect layers 402a may be disposed within one or more lower inter-level dielectric (ILD) layers (e.g., a low-k dielectric material, an ultra low-k dielectric material, or the like) having a first structural integrity. In some embodiments, the upper interconnect layers 402b may be disposed within one or more upper ILD layers having a second structural integrity that is greater than the first structural integrity. In some embodiments, to provide for increased structural support below a bond pad 110, the lower interconnect layers 402a may comprise vias disposed within via arrays configured to provide structural support to the bond pad 110. The via arrays 403 respectively have multiple vias disposed between vertically adjacent interconnect wires. In some embodiments, via arrays may not be disposed between vertically adjacent interconnect wires of the upper interconnect layers 402b.

In some embodiments, the bond pad 110 may have lower sidewalls 110s₁ coupled to upper sidewalls 110s2 by way of a horizontally extending lower surface 110h. In some embodiments, the lower sidewalls 110s₁ are angled so as to cause a width of a lower half of the bond pad 110 to decrease as a distance from the horizontally extending lower surface 110h increases. In some embodiments, the lower sidewalls 110s₁ are curved. In some embodiments, the upper sidewalls 110s2 are angled so as to cause a width of an upper half of the bond pad 110 to decrease as a distance from the horizontally extending lower surface 110h increases.

One or more upper passivation layers 208-210 are disposed over the bond pad 110. In some embodiments, the one or more upper passivation layers 208-210 may have rounded outer sidewalls facing away from a conductive bonding structure 116 disposed over the bond pad 110. In some embodiments, the one or more upper passivation layers 208-210 may have a greater thickness along an upper surface than along a sidewall.

Figure 5:
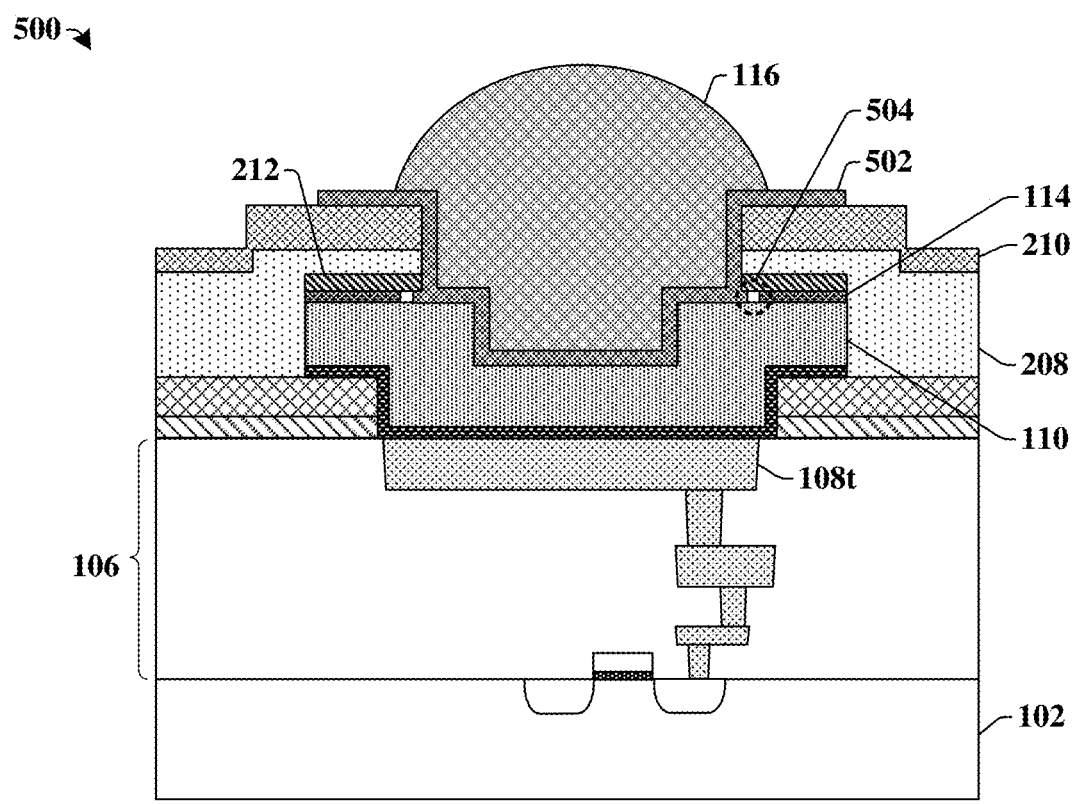
FIG. 5 illustrates a cross-sectional view of some additional embodiments of an integrated chip having a protective layer configured to improve a reliability of a bond pad.

FIG. 5 illustrates a cross-sectional view of some additional embodiments of an integrated chip 500 having a protective layer configured to improve a reliability of a bond pad.

The integrated chip comprises a bond pad 110 disposed over a dielectric structure 106 surrounding a plurality of interconnect layers 108. A protective layer 114 is disposed on the bond pad 110 and a mask layer 212 is disposed on the protective layer 114. One or more upper passivation layers 208-210 are over the mask layer 212.

An under bump metallurgy (UBM) structure 502 is disposed over the bond pad 110. In some embodiments, the UBM structure 502 includes a diffusion barrier layer and a seed layer. The diffusion barrier layer may also function as an adhesion layer (or a glue layer), in some embodiments. The diffusion barrier layer may comprise tantalum, tantalum nitride, titanium, titanium nitride, or combination thereof. The seed layer comprises a material that is configured to enable deposition of metal posts, solder bumps, or the like. In some embodiments, the UBM structure 502 may define a void 504 disposed between a sidewall of the protective layer 114 and the UBM structure 502. In other embodiments, the UBM structure 502 may directly contact the sidewall of the protective layer 114. A conductive bonding structure 116 (e.g., solder bump, copper post, a copper micro-post, or the like) may be disposed over the UBM structure 502.

FIGS. 6-16 illustrate cross-sectional views 600-1600 of some embodiments of a method of forming an integrated chip structure having a protective layer configured to improve a reliability of a bond pad. Although FIGS. 6-16 are described in relation to a method, it will be appreciated that the structures disclosed in FIGS. 6-16 are not limited to such a method, but instead may stand alone as structures independent of the method.

Figure 6:
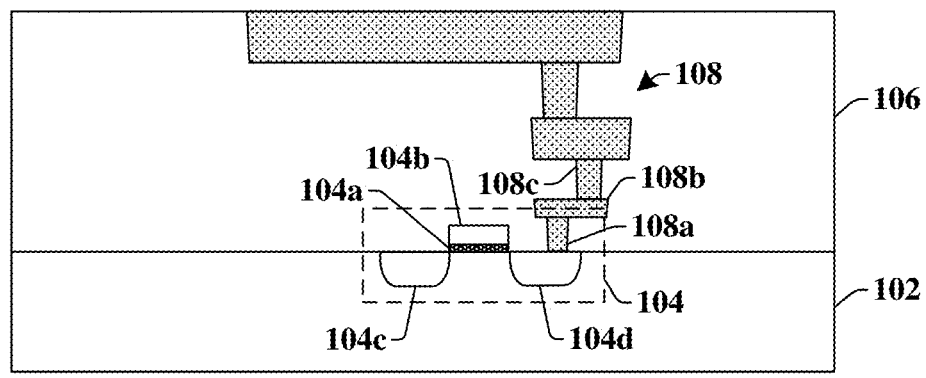
FIGS. 6-16 illustrate cross-sectional views of some embodiments of a method of forming an integrated chip structure having a protective layer configured to improve a reliability of a bond pad.

As shown in cross-sectional view 600 of FIG. 6, one or more transistor devices 104 are formed within a substrate 102. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the one or more transistor devices 104 may comprise a transistor formed by depositing a gate dielectric film and a gate electrode film over the substrate 102. The gate dielectric film and the gate electrode film are subsequently patterned to form a gate dielectric 104a and a gate electrode 104b. The substrate 102 may be subsequently implanted to form a source region 104c and a drain region 104d within the substrate 102 on opposing sides of the gate electrode 104b.

After formation of the one or more transistor devices 104, a plurality of interconnect layers 108 are formed within a dielectric structure 106 over the substrate 102. In some embodiments, the dielectric structure 106 may comprise a plurality of ILD layers. In some embodiments, the plurality of interconnect layers 108 may comprise a conductive contact 108a, an interconnect wire 108b, and an interconnect via 108c. In some embodiments, the plurality of interconnect layers 108 may be formed by forming one of the plurality of ILD layers, selectively etching the ILD layer to define a via hole and/or a trench within the ILD layer, forming a conductive material (e.g., copper, aluminum, etc.) within the via hole and/or a trench to fill the opening, and performing a planarization process (e.g., a chemical mechanical planarization process).

Figure 7:
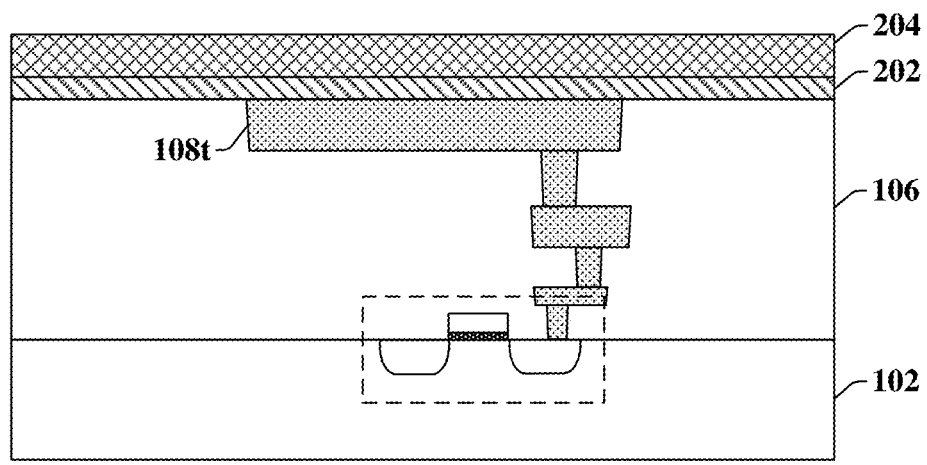

As shown in cross-sectional view 700 of FIG. 7, one or more lower passivation layers 202-204 may be formed over the dielectric structure 106. In some embodiments, forming the one or more lower passivation layers 202-204 may comprise forming a first lower passivation layer 202 over the dielectric structure 106 and subsequently forming a second lower passivation layer 204 over the first lower passivation layer 202. In some embodiments, the first lower passivation layer 202 may comprise a nitride (e.g., silicon nitride), a carbide (e.g., silicon carbide), or the like. In some embodiments, the first lower passivation layer 202 may be formed by way of a deposition process (e.g., CVD, PE-CVD, ALD, or the like) to a thickness in a range of between approximately 500 Angstroms (Å) and approximately 1,000 Å, between approximately 600 Å and approximately 800 Å, or other suitable values. In some embodiments, the second lower passivation layer 204 may comprise an oxide, a silicate glass (e.g., BSG, PSG, or the like), or the like. In some embodiments, the second lower passivation layer 204 may be formed by way of a deposition process (e.g., CVD, PE-CVD, ALD, or the like) to a thickness in a range of between approximately 5,000 Å and approximately 10,000 Å, between approximately 8,000 Å and approximately 9,000 Å, or other suitable values.

Figure 8:
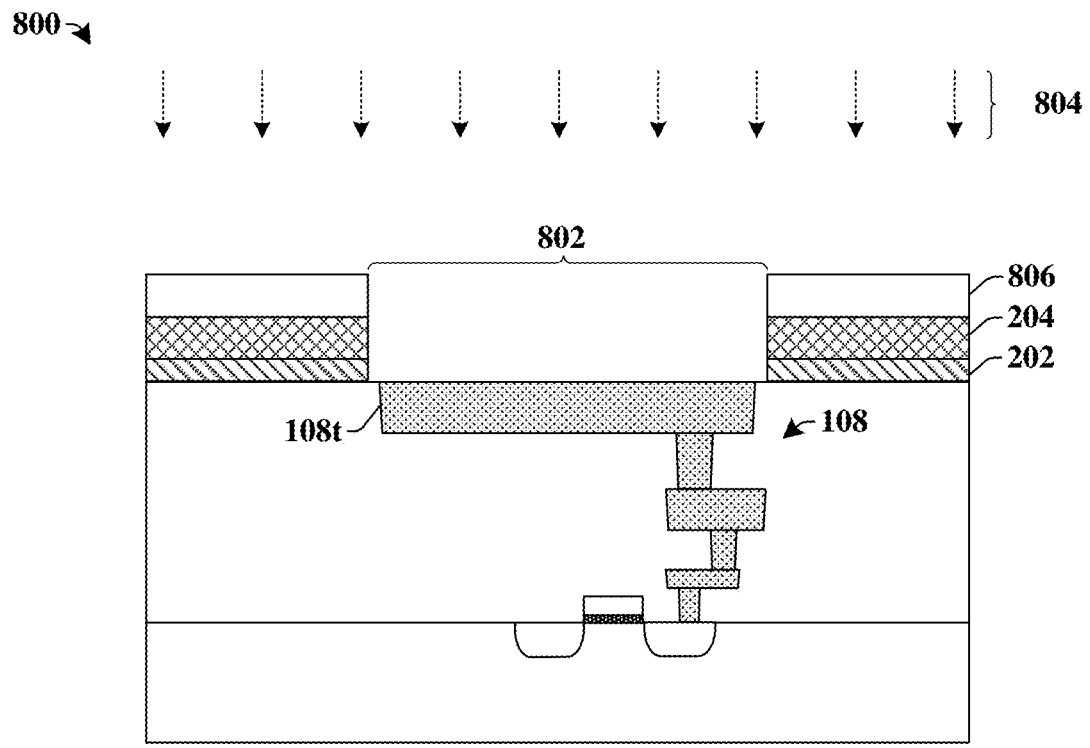

As shown in cross-sectional view 800 of FIG. 8, the one or more lower passivation layers 202-204 are selectively patterned according to a first etching process to form a bond pad opening 802 extending through the one or more lower passivation layers 202-204. In some embodiments, the bond pad opening 802 exposes a top interconnect layer 108$t$ of the plurality of interconnect layers 108. In some embodiments, the one or more lower passivation layers 202-204 may be selectively patterned by exposing the one or more lower passivation layers 202-204 to a first etchant 804 according to a first masking layer 806. In some embodiments, the first etchant 804 may comprise a dry etchant having an etching chemistry comprising fluorine, chlorine, or the like. In some embodiments, the first masking layer 806 may comprise a photosensitive material (e.g., a photoresist), a hard mask, or the like.

Figure 9:
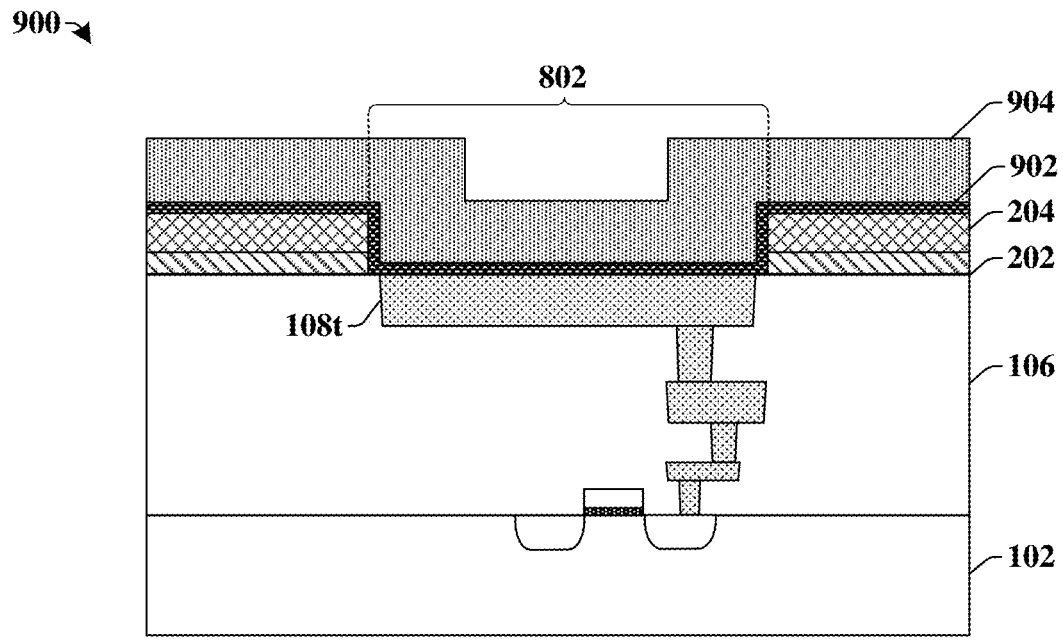

As shown in cross-sectional view 900 of FIG. 9, a glue material 902 is formed within the bond pad opening 802 and over an upper surface of the second lower passivation layer 204. In some embodiments, the glue material 902 may comprise tantalum nitride, titanium nitride, or the like. In some embodiments, the glue material 902 may be formed by a deposition process (e.g., CVD, PE-CVD, ALD, or the like) to a thickness that is in a range of between 200 Å and approximately 800 Å, between approximately 500 Å and approximately 700 Å, or other suitable values.

A bond pad layer 904 is formed within the bond pad opening 802 and over the glue material 902. In some embodiments, the bond pad layer 904 may comprise aluminum, copper, or the like. In some embodiments, the bond pad layer 904 may be formed by a deposition process (e.g., CVD, PE-CVD, ALD, or the like), a plating process, and/or the like. In various embodiments, the bond pad layer 904 may be formed to a thickness that is in a range of between 8,000 Å and approximately 15,000 Å, between approximately 10,000 Å and approximately 13,000 Å, or other suitable values.

Figure 10:
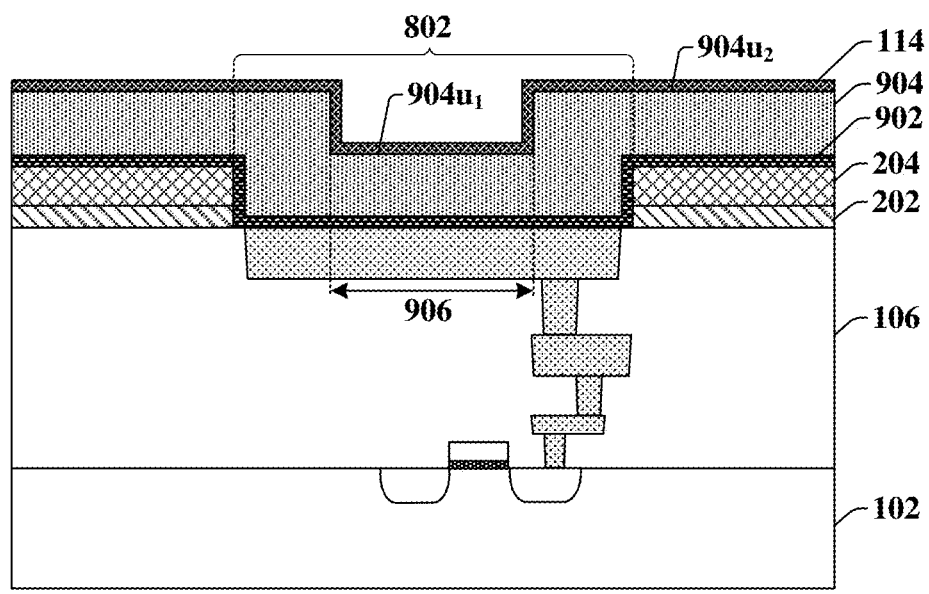

As shown in cross-sectional view 1000 of FIG. 10, a protective layer 114 is formed over the bond pad layer 904. In some embodiments, the protective layer 114 is or comprises a metal or a metallic compound. For example, the protective layer 114 may comprise a metal, such as titanium (e.g., titanium nitride, titanium oxide, or the like), tantalum (e.g., tantalum nitride), or the like. In some embodiments, the protective layer 114 may be formed by a deposition process (e.g., CVD, PE-CVD, ALD, or the like) to a thickness that is in a range of between approximately 100 Å and approximately 500 Å, between approximately 250 Å and approximately 350 Å, or other suitable values.

Because the bond pad layer 904 was formed within the bond pad opening 802 in the one or more lower passivation layers 202-204, the bond pad layer 904 has a first upper surface $904u_1$ and a second upper surface $904u_2$ that is over the first upper surface $904u_1$. In some embodiments, the first upper surface $904u_1$ of the bond pad 110 may have a width 906 that is greater than or equal to approximately 2 microns. Having the width 906 greater than or equal to approximately 2 microns prevents shadowing of a deposition process, which is used to form the protective layer 114, from affecting a thickness of the protective layer 114. For example, if the width 906 is less than approximately 2 microns, a deposition process having a slight angle may result in a non-uniformity of the protective layer 114 that can subsequently block opening of a bond pad.

Figure 11:
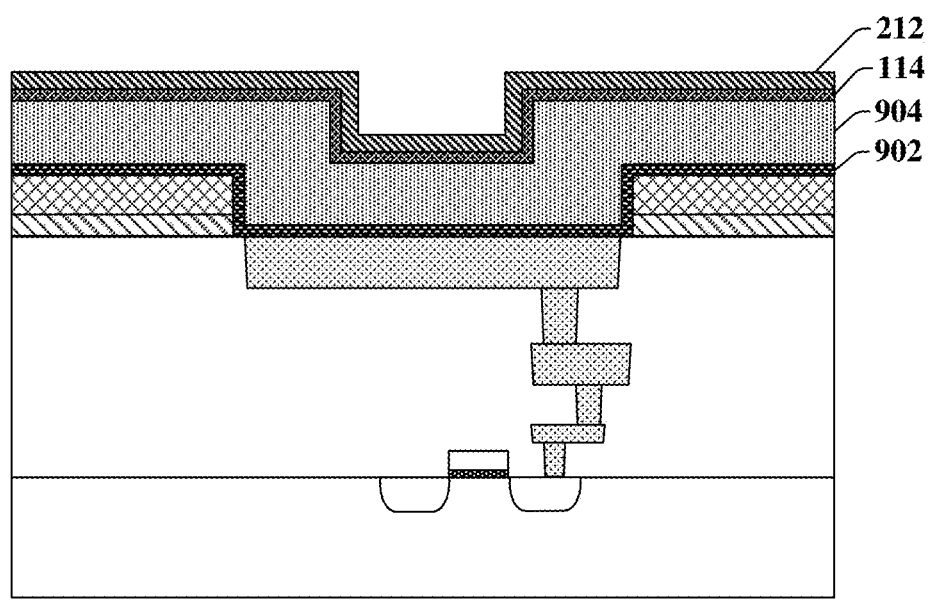

As shown in cross-sectional view 1100 of FIG. 11, a mask layer 212 is formed over the protective layer 114. In some embodiments, the mask layer 212 may comprise an oxynitride (e.g., silicon oxynitride), an oxycarbide (e.g., silicon oxycarbide), or the like. In some embodiments, the mask layer 212 may be formed by a deposition process (e.g., CVD, PE-CVD, ALD, or the like) to a thickness that is in a range of between 200 Å and approximately 500 Å, between approximately 200 Å and approximately 350 Å, or suitable values.

Figure 12:
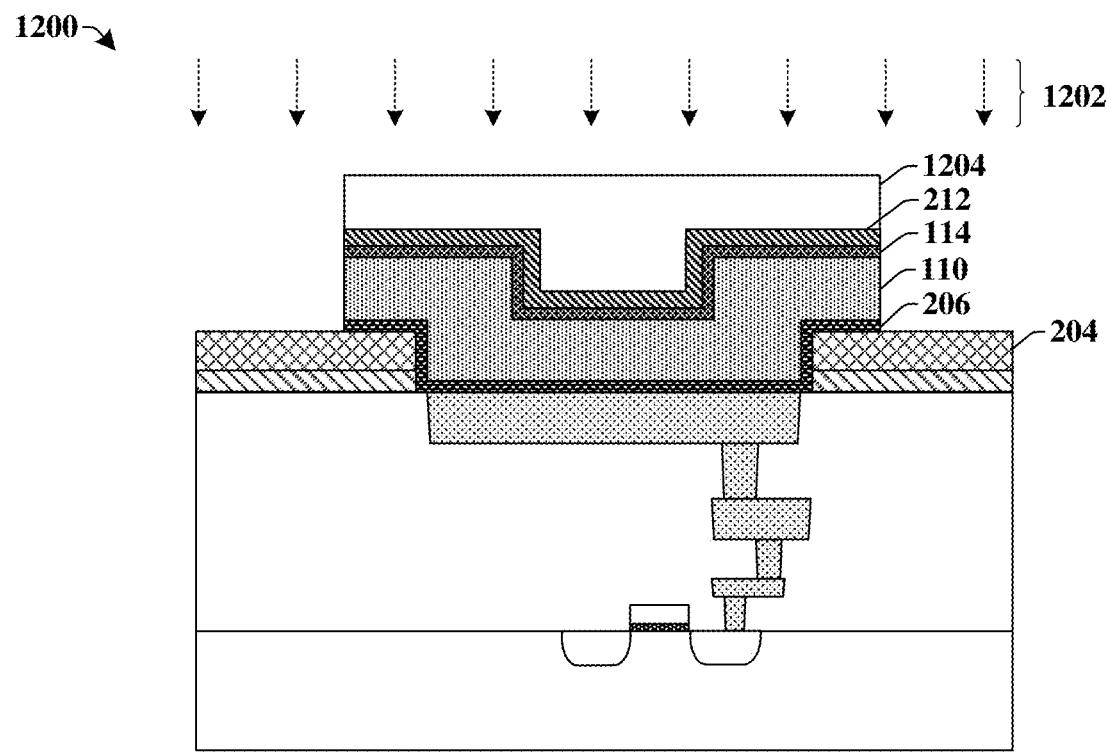

As shown in cross-sectional view 1200 of FIG. 12, the bond pad layer (904 of FIG. 11), the glue material (902 of FIG. 11), the protective layer 114, and the mask layer 212 are selectively patterned according to a second etching process. The second etching process confines the protective layer 114 and the mask layer 212 over a bond pad 110. In some embodiments, the bond pad layer (904 of FIG. 11), the glue material (902 of FIG. 11), the protective layer 114, and the mask layer 212 may be selectively patterned by exposing the bond pad layer (904 of FIG. 11), the glue material (902 of FIG. 11), the protective layer 114, and the mask layer 212 to a second etchant 1202 according to a second masking layer 1204. In some embodiments, the second etchant 1202 may comprise a dry etchant having an etching chemistry comprising fluorine, chlorine, or the like. In some embodiments, the second masking layer 1204 may comprise a photosensitive material (e.g., a photoresist), a hard mask, or the like.

Figure 13:
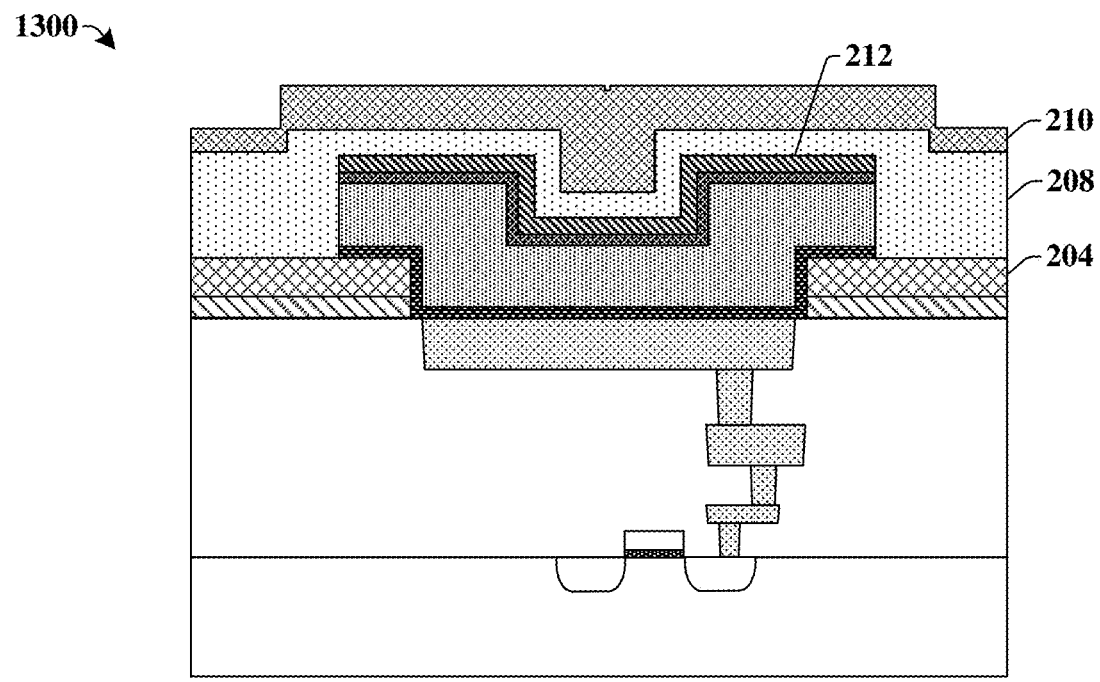

As shown in cross-sectional view 1300 of FIG. 13, one or more upper passivation layers 208-210 are formed over the mask layer 212. The one or more upper passivation layers 208-210 may comprise a first upper passivation layer 208 and a second upper passivation layer 210. In some embodiments, the first upper passivation layer 208 may comprise an oxide, USG, BPSG, or the like. In some embodiments, the first upper passivation layer 208 may be formed to a thickness that is in a range of between approximately 10,000 Å and approximately 15,000 Å, between approximately 11,000 Å and approximately 12,500 Å, or other suitable values. In some embodiments, the second upper passivation layer 210 may comprise a nitride (e.g., silicon nitride), a carbide (e.g., silicon carbide), or the like. In some embodiments, the second upper passivation layer 210 may be formed to a thickness that is in a range of between approximately 5,000 Å and approximately 10,000 Å, between approximately 8,000 Å and approximately 9,000 Å, or other suitable values.

Figure 14:
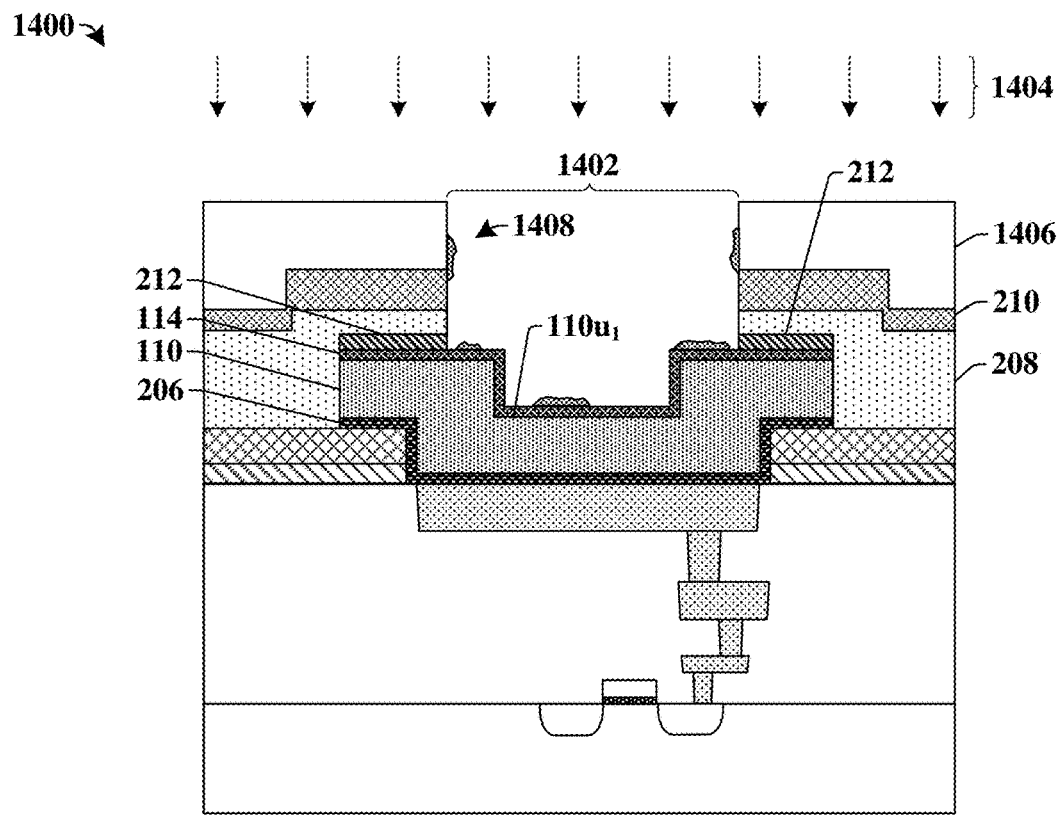

As shown in cross-sectional view 1400 of FIG. 14, the one or more upper passivation layers 208-210 and the mask layer 212 are selectively patterned to form a preliminary opening 1402 extending through the one or more upper passivation layers 208-210 and the mask layer 212. In some embodiments, the preliminary opening 1402 exposes an upper surface of the protective layer 114. In some embodiments, the one or more upper passivation layers 208-210 and the mask layer 212 may be selectively patterned by exposing the one or more upper passivation layers 208-210 and the mask layer 212 to a third etchant 1404 according to a third masking layer 1406. In some embodiments, the third etchant 1404 may comprise a dry etchant having an etching chemistry comprising fluorine, chlorine, or the like. In some embodiments, the third masking layer 1406 may comprise a photosensitive material (e.g., a photoresist), a hard mask, or the like.

In some embodiments, the third etchant 1404 may react with the protective layer 114 to form a metallic byproduct 1408 along an upper surface and/or sidewall of the protective layer 114 and/or along sidewalls of the one or more upper passivation layers 208-210. In some embodiments, the metallic byproduct 1408 may comprise fluorine. For example, in some embodiments, the metallic byproduct 1408 may comprise titanium-fluoride ($TiF_x$).

Figure 15:
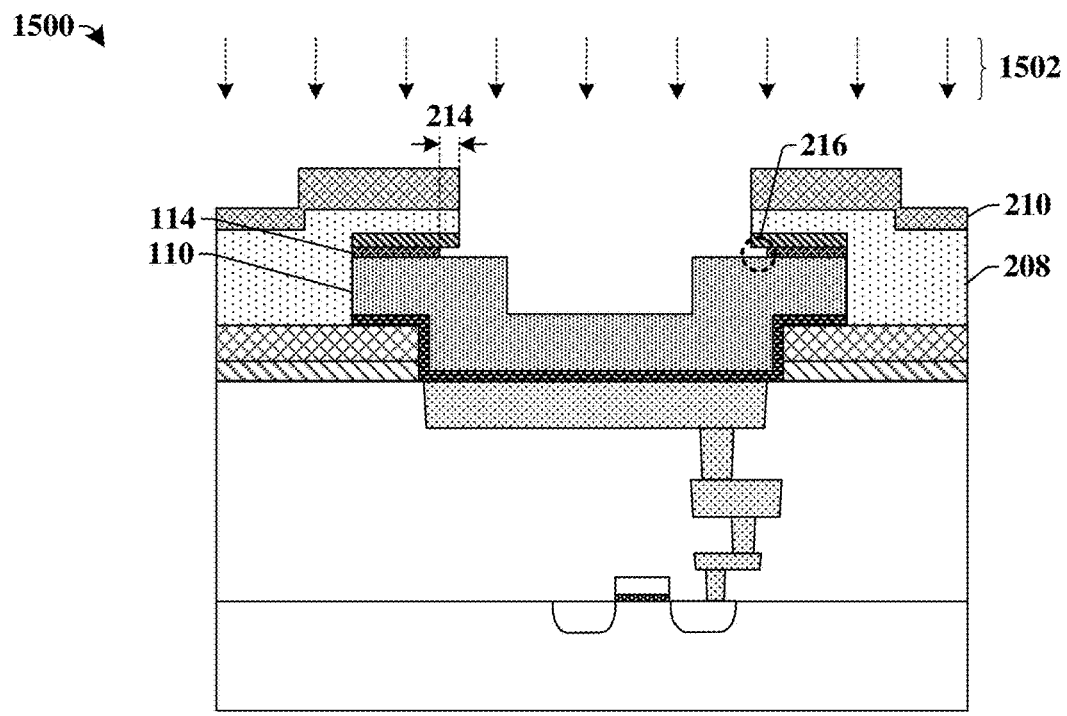

As shown in cross-sectional view 1500 of FIG. 15, a wet etching process is performed to remove a part of the protective layer 114 and to define an opening 113 exposing an upper surface of the bond pad 110. In some embodiments, the wet etching process may be performed by exposing the protective layer 114 to a wet etchant. In some embodiments, the wet etchant 1502 may comprise hydrogen peroxide ($H_2O_2$). In other embodiments, the wet etchant 1502 may comprise potassium hydroxide (KOH), hydrofluoric acid (HF), or the like. In some embodiments, the wet etchant may act upon the metallic byproduct (1408 of FIG. 14) and remove the metallic byproduct (1408 of FIG. 14) from sidewalls of the one or more upper passivation layers 208, 210.

The wet etchant 1502 has a high etching selectivity with respect to the one or more upper passivation layers 208-210 and the mask layer 212. The high etching selectivity causes the wet etchant 1502 to etch the protective layer 114 much faster than the one or more upper passivation layers 208-210 and the mask layer 212. For example, in some embodiments, an etching ratio of the protective layer 114 to the first upper passivation layer 208, the second upper passivation layer 210, and/or the mask layer 212 may be in a range of between 10:1 and 100:1, in a range of between 50:1 and 100:1, in a range of between 100:1 and 1,000:1, or other ranges. In other embodiments, an etching ratio of the protective layer 114 to the first upper passivation layer 208, the second upper passivation layer 210, and/or the mask layer 212 may be greater than approximately 10:1, greater than approximately 100:1, or greater than approximately 1,000:1.

In some embodiments, the wet etchant 1502 may both vertically and laterally etch the protective layer 114. In some such embodiments, the mask layer 212 may overhang a space between a sidewall of the protective layer 114 and a sidewall of the mask layer 212 after the wet etching process is completed. The resulting mask layer 212 laterally extends past a sidewall of the protective layer 114 to form a cavity 216 defined by the sidewall of the protective layer 114 and a lower surface of the mask layer 212. In some embodiments, the protective layer 114 may be laterally recessed by a non-zero distance 214 from sidewalls of the first upper passivation layer 208, the second upper passivation layer 210, and/or the mask layer 212. In some embodiments, the non-zero distance 214 may be in a range of between approximately 50 Å and approximately 500 Å, between approximately 200 Å and approximately 350 Å, or other suitable values.

In some embodiments, the wet etchant 1502 may also have a high etching selectivity with respect to the bond pad 110. The high etching selectivity causes the wet etchant to etch the protective layer 114 much faster than the bond pad 110. In some embodiments, the wet etchant 1502 may etch the protective layer 114 at a first etching rate that is in a range of between approximately 300 Å/min and approximately 400 Å/min and may etch the bond pad 110 at an etching rate of approximately 0 Å/min. In some embodiments, an etching ratio of the protective layer 114 to the bond pad 110 may be greater than approximately 10:1, greater than approximately 100:1, or greater than approximately 1000:1. The low etching rate of the bond pad 110 results in a bond pad 110 that has a substantially smooth upper surface (e.g., an upper surface that is smoother than that achieved by a dry etching process).

In some embodiments, after the wet etching process is completed an anneal process may be performed. The anneal process may remove moisture from the bond pad 110, the protective layer 114, the mask layer 212, and/or the one or more upper passivation layers 208-210 to prevent degradation (e.g., oxidation) of the bond pad 110. The anneal process may further and/or alternatively release a stress of metal within the bond pad 110. In some embodiments, the anneal process may be performed by exposing the substrate 102 to a temperature in a range of between approximately 100° C. and approximately 750° C., between approximately 200° C. and approximately 500° C., between approximately 250° C. and approximately 300° C., or other suitable ranges.

Figure 16:
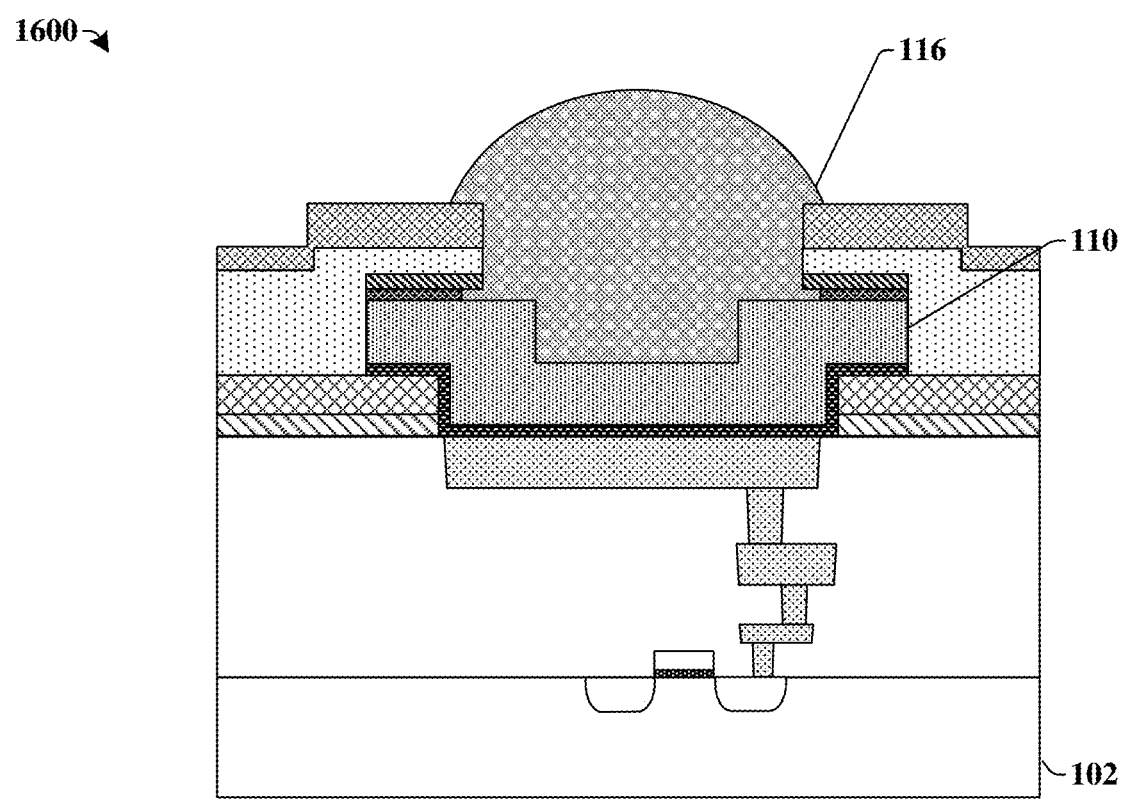

As shown in cross-sectional view 1600 of FIG. 16, a conductive bonding structure 116 is formed within the opening 113 defined by the one or more upper passivation layers 208-210. In some embodiments, the conductive bonding structure 116 may comprise a conductive bump (e.g., a solder bump).

Figure 17:
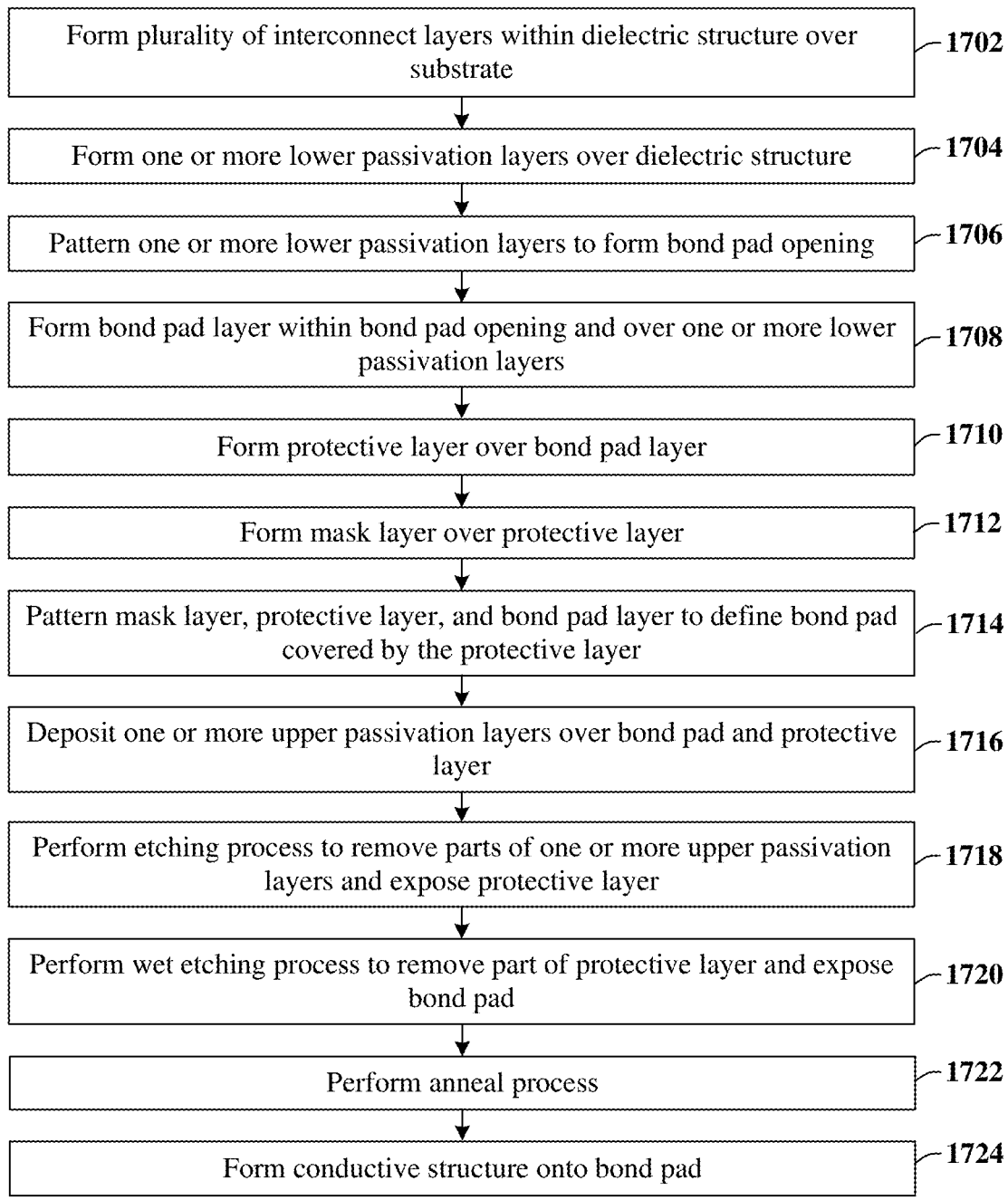
FIG. 17 illustrates a flow diagram of some embodiments of a method of forming an integrated chip structure having a protective layer configured to improve a reliability of a bond pad.

FIG. 17 illustrates a flow diagram of some embodiments of a method 1700 of forming an integrated chip structure having a protective layer configured to improve a reliability of a bond pad.

While the method 1700 disclosed herein is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1702, a plurality of interconnect layers are formed within a dielectric structure over a substrate. FIG. 6 illustrates a cross-sectional view 600 of some embodiments corresponding to act 1702.

At 1704, one or more lower passivation layers are formed over the dielectric structure. FIG. 7 illustrates a cross-sectional view 700 of some embodiments corresponding to act 1704.

At 1706, the one or more lower passivation layers are patterned to form a bond pad opening. FIG. 8 illustrates a cross-sectional view 800 of some embodiments corresponding to act 1706.

At 1708, a bond pad layer is formed within the bond pad opening and over the one or more lower passivation layers. FIG. 9 illustrates a cross-sectional view 900 of some embodiments corresponding to act 1708.

At 1710, a protective layer is formed over the bond pad layer. FIG. 10 illustrates a cross-sectional view 1000 of some embodiments corresponding to act 1710.

At 1712, a mask layer is formed over the protective layer. FIG. 11 illustrates a cross-sectional view 1100 of some embodiments corresponding to act 1712.

At 1714, the mask layer, the protective layer, and the bond pad layer are patterned to define a bond pad that is covered by the protective layer. FIG. 12 illustrates a cross-sectional view 1200 of some embodiments corresponding to act 1714.

At 1716, one or more upper passivation layers are formed over the bond pad. FIG. 13 illustrates a cross-sectional view 1300 of some embodiments corresponding to act 1716.

At 1718, an etching process is performed to remove parts of the one or more upper passivation layers and to form a preliminary opening that exposes the protective layer. FIG. 14 illustrates a cross-sectional view 1400 of some embodiments corresponding to act 1718.

At 1720, a wet etching process is performed to remove part of the protective layer and to form an opening that exposes an upper surface of the bond pad. FIG. 15 illustrates a cross-sectional view 1500 of some embodiments corresponding to act 1720.

At 1722, an anneal process is performed. FIG. 15 illustrates a cross-sectional view 1500 of some embodiments corresponding to act 1722.

At 1724, a conductive structure (e.g., a conductive bump) is formed onto the bond pad. FIG. 16 illustrates a cross-sectional view 1600 of some embodiments corresponding to act 1724.

Accordingly, in some embodiments, the present disclosure relates to a bond pad structure of an integrated chip, which has a protective layer that is disposed onto a conductive bond pad and that is configured to mitigate formation of etching byproducts (e.g., fluorine-metal byproducts) onto the conductive bond pad.

In some embodiments, the present disclosure relates to a method of forming an integrated chip. The method includes forming a bond pad layer onto a dielectric structure formed over a substrate, the dielectric structure surrounding a plurality of interconnect layers; forming a protective layer onto the bond pad layer; patterning the bond pad layer and the protective layer to define a bond pad covered by the protective layer; forming one or more upper passivation layers over the protective layer; performing a dry etching process to form an opening extending through the one or more upper passivation layers to the protective layer; and performing a wet etching process to remove a part of the protective layer and expose an upper surface of the bond pad. In some embodiments, the dry etching process uses a dry etchant having an etching chemistry comprising fluorine. In some embodiments, the wet etching process laterally etches the protective layer, so that the protective layer is laterally recessed past a sidewall of the one or more upper passivation layers. In some embodiments, the method further includes forming a mask layer over the protective layer prior to patterning the bond pad layer and the protective layer; forming a first masking layer over the mask layer; and etching the mask layer, the protective layer, and the bond pad layer according to the first masking layer. In some embodiments, the mask layer overhangs a space between a sidewall of the protective layer and a sidewall of the mask layer after the wet etching process is completed. In some embodiments, the dry etching process forms a metallic byproduct onto one or more sidewalls of the one or more upper passivation layers; and the wet etching process removes the metallic byproduct from the one or more sidewalls of the one or more upper passivation layers. In some embodiments, the wet etching process forms sidewalls of the protective layer that further define the opening over the bond pad. In some embodiments, the protective layer includes titanium nitride. In some embodiments, the dry etching process forms a metallic byproduct along a top of the protective layer, the metallic byproduct including fluorine and titanium.

In other embodiments, the present disclosure relates to a method of forming an integrated chip. The method includes forming a bond pad layer over a substrate; forming a protective layer onto the bond pad layer; patterning the bond pad layer and the protective layer to define a bond pad covered by the protective layer; forming one or more upper passivation layers over the protective layer; etching the one or more upper passivation layers to expose an upper surface of the protective layer; performing a wet etching process to remove part of the protective layer from an upper surface of the bond pad; and forming a conductive bump over the bond pad after performing the wet etching process. In some embodiments, the wet etching process is configured to etch the protective layer at a faster rate than the one or more upper passivation layers and the bond pad. In some embodiments, the one or more upper passivation layers laterally contact a sidewall of the protective layer. In some embodiments, the method further includes forming a mask layer over the protective layer prior to forming the one or more upper passivation layers. In some embodiments, the protective layer includes a metal.

In yet other embodiments, the present disclosure relates to an integrated chip. The integrated chip includes a plurality of interconnect layers disposed within a dielectric structure over a substrate; a bond pad disposed over the dielectric structure; one or more upper passivation layers disposed over the dielectric structure and the bond pad, the one or more upper passivation layers including one or more sidewalls defining an opening directly over the bond pad; and a protective layer including a metal that is disposed directly between the one or more upper passivation layers and the bond pad, the metal having one or more sidewalls that further define the opening. In some embodiments, the one or more upper passivation layers include a lower surface that faces the bond pad and that extends past the one or more sidewalls of the metal. In some embodiments, the one or more upper passivation layers include a first upper passivation layer disposed along a sidewall of the bond pad and directly over an upper surface of the bond pad; and a second upper passivation layer disposed over the first upper passivation layer, both the first upper passivation layer and the second upper passivation layer continuously and laterally extending past the one or more sidewalls of the protective layer. In some embodiments, the protective layer includes titanium nitride. In some embodiments, the integrated chip further includes a mask layer disposed over the protective layer and below the one or more upper passivation layers, the mask layer laterally extending past the one or more sidewalls of the protective layer. In some embodiments, the protective layer has a bottom surface contacting the bond pad and an upper surface contacting the mask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
   forming a bond pad layer onto a dielectric structure formed over a substrate, wherein the dielectric structure surrounds a plurality of interconnect layers;

forming a protective layer onto the bond pad layer;
patterning the bond pad layer and the protective layer to define a bond pad covered by the protective layer;
forming one or more upper passivation layers over the protective layer;
performing a dry etching process to form an opening extending through the one or more upper passivation layers to the protective layer; and
performing a wet etching process to remove a part of the protective layer and expose an upper surface of the bond pad, wherein the wet etching process laterally etches the protective layer, so that the protective layer is laterally recessed past a sidewall of the one or more upper passivation layers.

2. The method of claim 1, wherein the dry etching process uses a dry etchant having an etching chemistry comprising fluorine.

3. The method of claim 1, further comprising:
forming a mask layer over the protective layer prior to patterning the bond pad layer and the protective layer;
forming a first masking layer over the mask layer; and
etching the mask layer, the protective layer, and the bond pad layer according to the first masking layer.

4. The method of claim 3, wherein the mask layer overhangs a space between a sidewall of the protective layer and a sidewall of the mask layer after the wet etching process is completed.

5. The method of claim 1,
wherein the dry etching process forms a metallic byproduct onto one or more sidewalls of the one or more upper passivation layers; and
wherein the wet etching process removes the metallic byproduct from the one or more sidewalls of the one or more upper passivation layers.

6. The method of claim 1, wherein the wet etching process forms sidewalls of the protective layer that further define the opening over the bond pad.

7. The method of claim 1, wherein the protective layer comprises titanium nitride.

8. The method of claim 1, wherein the dry etching process forms a metallic byproduct along a top of the protective layer, the metallic byproduct comprising fluorine and titanium.

9. A method of forming an integrated chip, comprising:
forming a bond pad layer over a substrate;
forming a protective layer onto the bond pad layer;
patterning the bond pad layer and the protective layer to define a bond pad covered by the protective layer;
forming one or more upper passivation layers over the protective layer;
etching the one or more upper passivation layers to expose an upper surface of the protective layer;
forming a mask layer over the protective layer prior to forming the one or more upper passivation layers;
performing a wet etching process to remove part of the protective layer from an upper surface of the bond pad; and
forming a conductive bump over the bond pad after performing the wet etching process.

10. The method of claim 9, wherein the wet etching process is configured to etch the protective layer at a faster rate than the one or more upper passivation layers and the bond pad.

11. The method of claim 9, wherein the one or more upper passivation layers laterally contact a sidewall of the protective layer.

12. The method of claim 9, wherein the protective layer comprises a metal.

13. An integrated chip, comprising:
a plurality of interconnect layers disposed within a dielectric structure over a substrate;
a bond pad disposed over the dielectric structure;
one or more upper passivation layers disposed over the dielectric structure and the bond pad, wherein the one or more upper passivation layers comprise one or more sidewalls defining an opening directly over the bond pad;
a protective layer comprising a metal that is disposed directly between the one or more upper passivation layers and the bond pad, the metal having one or more sidewalls that further define the opening; and
a mask layer disposed over the protective layer and below the one or more upper passivation layers, wherein the mask layer laterally extends past the one or more sidewalls of the protective layer.

14. The integrated chip of claim 13, wherein the one or more upper passivation layers comprise a lower surface that faces the bond pad and that extends past the one or more sidewalls of the metal.

15. The integrated chip of claim 13, wherein the one or more upper passivation layers comprise:
a first upper passivation layer disposed along a sidewall of the bond pad and directly over an upper surface of the bond pad; and
a second upper passivation layer disposed over the first upper passivation layer, wherein both the first upper passivation layer and the second upper passivation layer continuously and laterally extend past the one or more sidewalls of the protective layer.

16. The integrated chip of claim 13, wherein the protective layer comprises titanium nitride.

17. The integrated chip of claim 13, wherein the protective layer has a bottom surface contacting the bond pad and an upper surface contacting the mask layer.

18. The integrated chip of claim 13, wherein the bond pad comprises interior sidewalls coupled to a recessed upper surface to define a recess within a top surface of the bond pad, the protective layer being completely confined directly over the top surface of the bond pad.

19. The integrated chip of claim 13, wherein the mask layer comprises silicon oxynitride.

20. The integrated chip of claim 13, wherein the mask layer continuously extends between a lower surface contacting the protective layer and an upper surface contacting the one or more upper passivation layers.

* * * * *